(12) United States Patent
Ofuji et al.

(10) Patent No.: US 11,664,405 B2
(45) Date of Patent: May 30, 2023

(54) SEMICONDUCTOR LIGHT DETECTION ELEMENT

(71) Applicant: HAMAMATSU PHOTONICS K.K., Hamamatsu (JP)

(72) Inventors: Kazuto Ofuji, Hamamatsu (JP); Masashi Ito, Hamamatsu (JP); Katsumi Shibayama, Hamamatsu (JP); Akira Sakamoto, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 42 days.

(21) Appl. No.: 17/499,135

(22) Filed: Oct. 12, 2021

(65) Prior Publication Data

US 2022/0028906 A1    Jan. 27, 2022

Related U.S. Application Data

(63) Continuation of application No. 16/491,193, filed as application No. PCT/JP2018/007843 on Mar. 1, 2018, now Pat. No. 11,205,676.

(30) Foreign Application Priority Data

Mar. 8, 2017  (JP) .................. 2017-044179

(51) Int. Cl.
    *H01L 27/148*   (2006.01)
    *H01L 27/146*   (2006.01)
(52) U.S. Cl.
    CPC .... *H01L 27/14887* (2013.01); *H01L 27/1462* (2013.01); *H01L 27/14623* (2013.01)
(58) Field of Classification Search
    CPC ........... H01L 27/14887; H01L 27/1462; H01L 27/14623

USPC ......................................................... 257/230
See application file for complete search history.

(56) References Cited

U.S. PATENT DOCUMENTS

| 2006/0174932 A1 | 8/2006 | Usui et al. |
| 2008/0055451 A1 | 3/2008 | Kanbe |
| 2008/0251723 A1 | 10/2008 | Ward et al. |
| 2009/0140167 A1 | 6/2009 | Ward et al. |
| 2011/0024792 A1 | 2/2011 | Bins et al. |

(Continued)

FOREIGN PATENT DOCUMENTS

| CN | 101820036 A | 9/2010 |
| CN | 105209383 A | 12/2015 |

(Continued)

OTHER PUBLICATIONS

International Preliminary Report on Patentability dated Sep. 19, 2019 for PCT/JP2018/007843.

*Primary Examiner* — Igwe U Anya
(74) *Attorney, Agent, or Firm* — Faegre Drinker Biddle & Reath LLP

(57) ABSTRACT

Provided a semiconductor light detection element including: a semiconductor portion having a front surface including a light reception region that receives incident light and photoelectrically converting the incident light incident on the light reception region; a metal portion provided on the front surface; and a carbon nanotube film provided on the light reception region and formed by depositing a plurality of carbon nanotubes. The carbon nanotube film extends over an upper surface of the metal portion from an upper surface of the light reception region.

9 Claims, 11 Drawing Sheets

(56) References Cited

U.S. PATENT DOCUMENTS

| | | |
|---|---|---|
| 2011/0176128 A1 | 7/2011 | Matsuno |
| 2011/0212566 A1* | 9/2011 | Portico Ambrosio . B82Y 10/00 |
| | | 257/E31.127 |
| 2012/0013905 A1 | 1/2012 | Nozawa |
| 2012/0133947 A1 | 5/2012 | Nozawa |
| 2012/0247808 A1 | 10/2012 | Lam |
| 2013/0302605 A1 | 11/2013 | Yang et al. |
| 2014/0238477 A1 | 8/2014 | Fucinato |
| 2014/0360585 A1 | 12/2014 | Sugiura et al. |
| 2016/0012975 A1* | 1/2016 | Maruyama ............ C01B 32/162 |
| | | 977/843 |
| 2016/0104554 A1 | 4/2016 | Zhong et al. |
| 2016/0370230 A1 | 12/2016 | Nishimura |

FOREIGN PATENT DOCUMENTS

| | | |
|---|---|---|
| JP | H7-038135 A | 2/1995 |
| JP | 2003-303978 A | 10/2003 |
| JP | 2005-332991 A | 12/2005 |
| JP | 2006-245566 A | 9/2006 |
| JP | 2007-27186 A | 2/2007 |
| JP | 2009-060051 A | 3/2009 |
| JP | 2009-253289 A | 10/2009 |
| JP | 2010-283328 A | 12/2010 |
| JP | 2013-098564 A | 5/2013 |
| JP | 2015-73006 A | 4/2015 |
| WO | WO 2009/093698 A1 | 7/2009 |
| WO | WO 2014/133183 A1 | 9/2014 |

\* cited by examiner

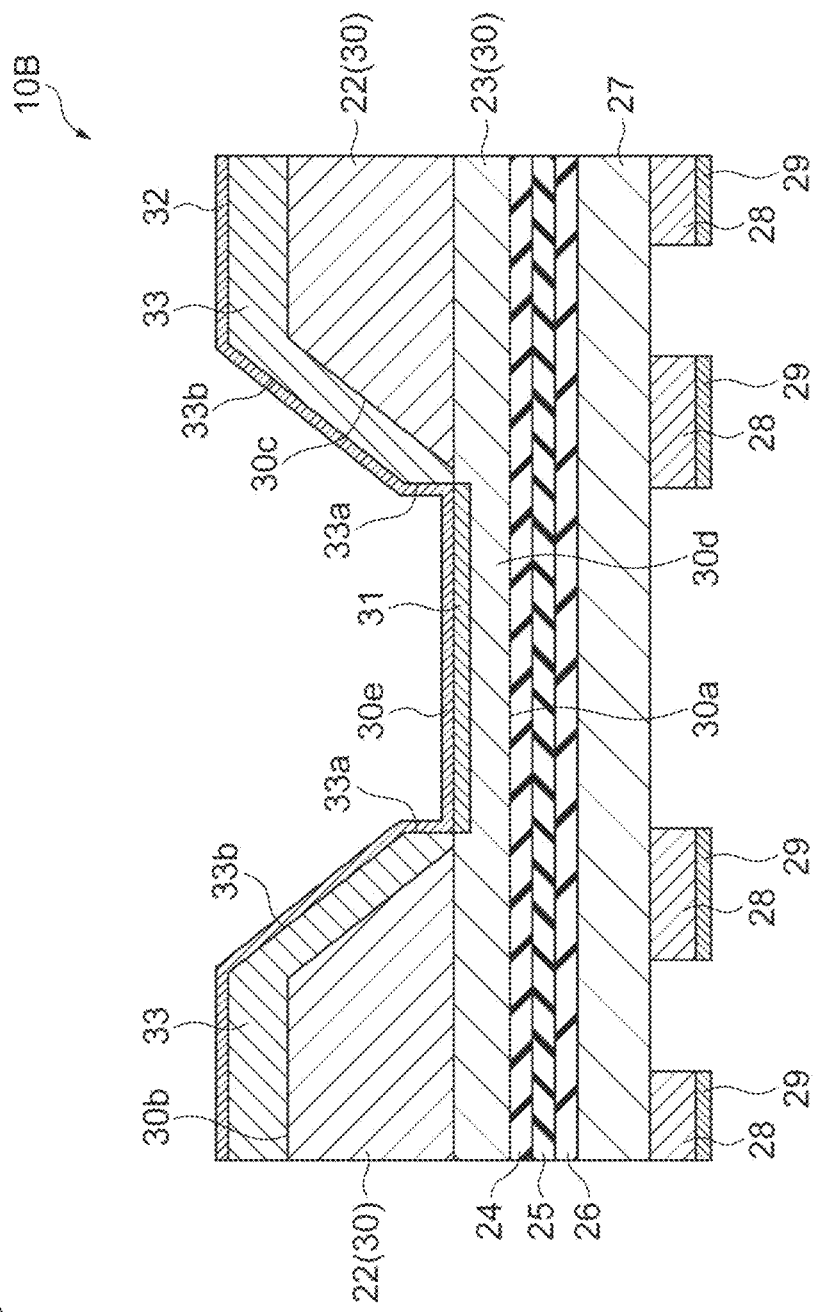

SEMICONDUCTOR LIGHT DETECTION ELEMENT

CROSS-REFERENCE TO RELATED APPLICATIONS

This application is a continuation of U.S. patent application Ser. No. 16/491,193, filed Sep. 5, 2019, which is 371 of International Patent Application No. PCT/JP2018/007843, filed Mar. 1, 2018, which claims the benefit of priority to Japanese Patent Application No. 2017-044179, filed Mar. 8, 2017, the contents of each of which is incorporated herein by reference.

TECHNICAL FIELD

The present disclosure relates to a semiconductor light detection element.

BACKGROUND ART

Patent Literature 1 discloses a semiconductor light detection element capable of suppressing a decrease in monitor accuracy with respect to laser light as the number of times of use increases. This semiconductor light detection element is a semiconductor light detection element that generates carriers in response to incident light and includes a silicon substrate, a noble metal film, and an underlayer. The silicon substrate is the second conductivity type and includes a first conductivity type impurity region provided on the first front surface. The noble metal film is provided on at least one front surface of the first and second front surfaces of the silicon substrate. The underlayer is provided between the noble metal film and the silicon substrate and is a layer having higher adhesion to the silicon substrate than the noble metal film. Thus, the provision of the noble metal film on the front surface of the silicon substrate reduces the charge-up when light is incident on the front surface of the silicon substrate.

CITATION LIST

Patent Literature

Patent Literature 1: Japanese Unexamined Patent Publication No. 2007-27186

SUMMARY OF INVENTION

Technical Problem

In the case of detecting ultraviolet light by using a semiconductor light detection element, deterioration of detection sensitivity (reduction of detection sensitivity due to continuous irradiation relative to detection sensitivity before the irradiation) becomes a problem. The deterioration of detection sensitivity is caused by charges generated on a front surface of a semiconductor by irradiation of ultraviolet light having high energy allowing the front surface of the semiconductor to charge-up. If the detection sensitivity of the semiconductor light detection element deteriorates, the number of carriers output with respect to ultraviolet light having a certain intensity gradually decreases, so that the detection accuracy of the ultraviolet light is gradually reduced.

In order to solve such a problem, in the semiconductor light detection element described in Patent Literature 1, a noble metal film is provided on the front surface of the semiconductor through an underlayer, and thus, charges are released through the noble metal film, so that the charge-up of the front surface of the semiconductor is prevented. However, due to reflection and absorption of the ultraviolet light in the noble metal film, the light amount of the ultraviolet light incident on the front surface of the semiconductor is greatly reduced, and as a result, there is a problem that the detection sensitivity is deteriorated.

The present disclosure has been made in view of such problems, and the present disclosure is to provide a semiconductor light detection element capable of suppressing charge-up on a front surface of a semiconductor and suppressing a decrease in detection sensitivity as compared with, for example, a case where a noble metal film is provided.

Solution to Problem

In order to solve the problem described above, according to one aspect of the present disclosure, there is provided a semiconductor light detection element including: a semiconductor portion having a front surface including a light reception region that receives incident light and photoelectrically converting the incident light incident on the light reception region; a metal portion provided on the front surface; and a carbon nanotube film provided on the light reception region and formed by depositing a plurality of carbon nanotubes. The carbon nanotube film extends over an upper surface of the metal portion from an upper surface of the light reception region.

In this semiconductor light detection element, a carbon nanotube film in which a plurality of carbon nanotubes are deposited is provided on the light reception region. The carbon nanotube has enough conductivity to release the charges generated on the front surface of the semiconductor portion. Therefore, similarly to a case where a noble metal film is provided, for example, the charge-up of the front surface of the semiconductor portion can be appropriately prevented. Furthermore, carbon nanotubes have high transparency as compared with, for example, noble metals. Therefore, the reflection and absorption of the ultraviolet light can be reduced, and thus, the reduction of the light amount of the ultraviolet light incident on the front surface of the semiconductor portion can be suppressed. As a result, according to this semiconductor light detection element, it is possible to suppress a decrease in detection sensitivity as compared with, for example, a case where a noble metal film is provided.

In addition, in the semiconductor light detection element, the metal portion is provided on the front surface of the semiconductor portion. In one example, the metal portion is an electrode electrically conducted to the semiconductor portion. In another example, the metal portion is a light shielding film for preventing light from being incident on a region other than the light reception region. The carbon nanotube film extends over the upper surface of the metal portion from the upper surface of the light reception region. Thus, the charges transferred from the front surface of the semiconductor portion to the carbon nanotube film can be appropriately released through the metal portion. In addition, if such a configuration is to be realized, for example, in the noble metal film of Patent Literature 1, there is a concern that electrical conduction failure may occur due to disconnection of the noble metal film at the step difference between the front surface of the semiconductor portion and the metal portion. In many cases, the noble metal film is formed by vapor deposition (physical vapor deposition (PVD), chemical vapor deposition (CVD), or the like), but the noble metal is less likely to adhere to the side surface. On the other hand, in the carbon nanotube film, since long fibrous carbon nanotubes can extend from the front surface of the semiconductor portion to the upper surface of the metal portion, electrical conduction can be appropriately performed also at the step difference between the front surface of the semiconductor portion and the metal portion.

In the above-described semiconductor light detection element, a plurality of carbon nanotubes may be configured with bundle-shaped carbon nanotubes and non-bundle-shaped carbon nanotubes. Even in such a case, it is possible to preferably realize a carbon nanotube film that exhibits the above-described function.

In the above-described semiconductor light detection element, a sheet resistance of the carbon nanotube film may be $10^4 \Omega/\Box$ or more. By reducing a density of carbon nanotubes constituting the carbon nanotube film (that is, reducing the amount of carbon nanotubes per unit volume), transmittance of ultraviolet rays is improved. On the other hand, although the sheet resistance is increased, it is sufficient that the above-described carbon nanotube film can release the charges generated on the front surface of the semiconductor portion. Therefore, such a high conductivity as a so-called transparent electrode is not necessarily required for the carbon nanotube film, and if the carbon nanotube film has a relatively large sheet resistance, it is possible to achieve both high ultraviolet-ray transparency and sufficient conductivity.

In the above-described semiconductor light detection element, a length of a plurality of carbon nanotubes contained in the carbon nanotube film may be equal to or larger than a height of the upper surface of the metal portion relative to the front surface. As a result, it is possible to more effectively prevent the electrical conduction failure due to the disconnection of the carbon nanotube film at the step difference between the front surface of the semiconductor portion and the metal portion.

In the above-described semiconductor light detection element, a length of a plurality of carbon nanotubes contained in the carbon nanotube film may be 1 µm or more. Since the height of the upper surface of the metal portion relative to the front surface of the semiconductor portion is typically 1 µm or less, it is possible to more effectively prevent the electrical conduction failure due to the disconnection of the carbon nanotube film at the step difference between the front surface of the semiconductor portion and the metal portion.

In the above-described semiconductor light detection element, a ratio of single-walled carbon nanotubes contained in the carbon nanotube film may be larger than a ratio of multi-walled carbon nanotubes. The single-walled carbon nanotubes have higher transparency than the multi-walled carbon nanotubes while having the same degree of conductivity as the multi-walled carbon nanotubes. Therefore, according to such a configuration, it is possible to more effectively suppress a decrease in detection sensitivity of the semiconductor light detection element while appropriately preventing the charge-up of the front surface of the semiconductor portion.

Alternatively, in the above-described semiconductor light detection element, the ratio of the multi-walled carbon nanotubes contained in the carbon nanotube film may be larger than the ratio of the single-walled carbon nanotubes. Generally, the process of manufacturing the multi-walled carbon nanotubes is simpler than the process of manufacturing the single-walled carbon nanotubes, and the multi-walled carbon nanotubes can be manufactured at lower cost than the single-walled carbon nanotubes. Therefore, according to such a configuration, it is possible to provide a low cost semiconductor light detection element that is easy to manufacture.

In the above-described semiconductor light detection element, the transmittance of the carbon nanotube film in a wavelength range of 400 nm or less may be 85% or more. Therefore, it is possible to provide a semiconductor light detection element having sufficient detection sensitivity to ultraviolet light. In this case, the transmittance of the carbon nanotube film in a wavelength range of 200 nm or more may be 85% or more.

Advantageous Effects of Invention

According to the semiconductor light detection element according to the present disclosure, it is possible to suppress charge-up on the front surface of a semiconductor and suppressing a decrease in detection sensitivity as compared with a case where a noble metal film is provided.

BRIEF DESCRIPTION OF DRAWINGS

FIG. 11 is a cross-sectional view illustrating a configuration of a solid-state imaging element as a semiconductor light detection element according to a second embodiment of the present disclosure.

DESCRIPTION OF EMBODIMENTS

Figure 1:
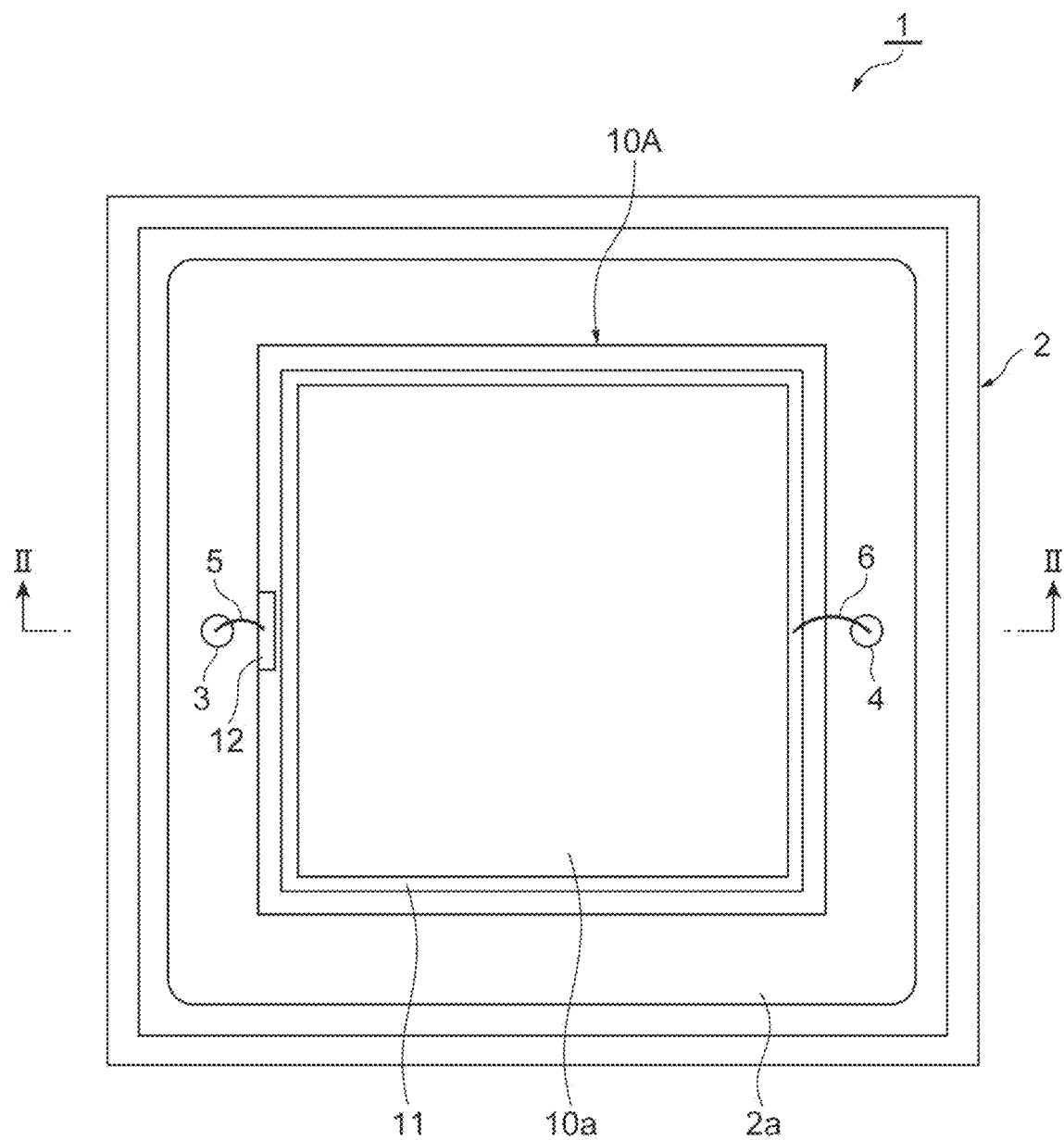
FIG. 1 is a plan view illustrating a configuration of a light detection device according to a first embodiment of the present disclosure.

Hereinafter, embodiments of a semiconductor light detection element according to the present disclosure will be described in detail with reference to the accompanying drawings. In addition, in the description of the drawings, the same elements will be denoted by the same reference numerals, and redundant description will be omitted.

First Embodiment

Figure 2:
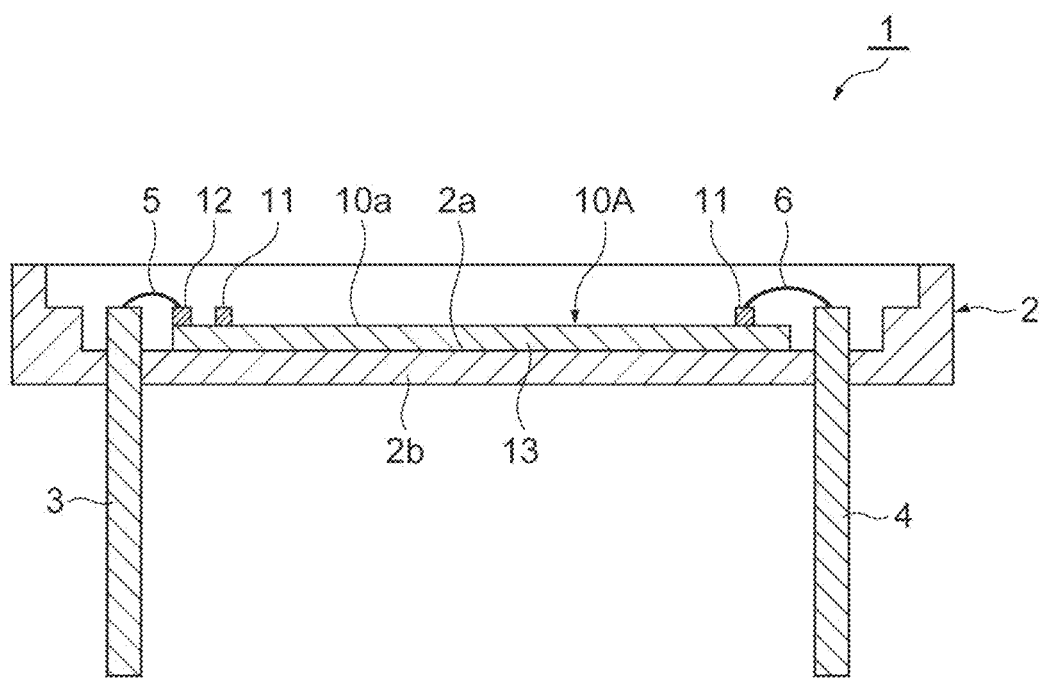
FIG. 2 is a cross-sectional view taken along line II-II of the light detection device illustrated in FIG. 1.

FIG. 1 is a plan view illustrating a configuration of a light detection device 1 according to a first embodiment of the present disclosure. FIG. 2 is a cross-sectional view taken along line II-II of the light detection device 1 illustrated in FIG. 1. As illustrated in FIGS. 1 and 2, the light detection device 1 according to the present embodiment includes a package 2 and a semiconductor light detection element 10A accommodated in the package 2. The light detection device 1 according to the present embodiment is a device for mainly detecting the intensity of ultraviolet light.

The package 2 has, for example, a planar shape such as a quadrangle and has a concave accommodation space. The semiconductor light detection element 10A is accommodated in the accommodation space. The semiconductor light detection element 10A is mounted on a bottom surface 2a that defines the accommodation space of the package 2. The semiconductor light detection element 10A has, for example, a planar shape such as a quadrangle and includes a semiconductor portion 13, a cathode electrode 11 and a first anode electrode 12 provided on the front surface of the semiconductor portion 13, and a second anode electrode (not illustrated) provided on the back surface of the semiconductor portion 13. A light reception region 10a that receives incident light is provided on the front surface of the semiconductor portion 13. The light reception region 10a has, for example, a planar shape such as a quadrangle similarly to the semiconductor light detection element 10A. The cathode electrode 11 surrounds the light reception region 10a and has, for example, a planar shape such as a quadrangular frame shape. The first anode electrode 12 is provided in a portion of the light reception region 10a in a circumferential direction and is provided outside the cathode electrode 11.

The package 2 has a pair of metal pins 3 and 4 penetrating a bottom plate portion 2b of the package 2. One end of each of the pins 3 and 4 is located in the accommodation space of the package 2 on the bottom surface 2a, and the other end of each of the pins 3 and 4 is located outside the accommodation space of the package 2 on the back side of the bottom surface 2a. One end of the pin 3 is electrically connected to the first anode electrode 12 of the semiconductor light detection element 10A through a bonding wire 5 and is also electrically connected to the second anode electrode. One end of the pin 4 is electrically connected to the cathode electrode 11 of the semiconductor light detection element 10A through a bonding wire 6. In one embodiment, the semiconductor light detection element 10A is disposed between one end of the pin 3 and one end of the pin 4.

Figure 3:
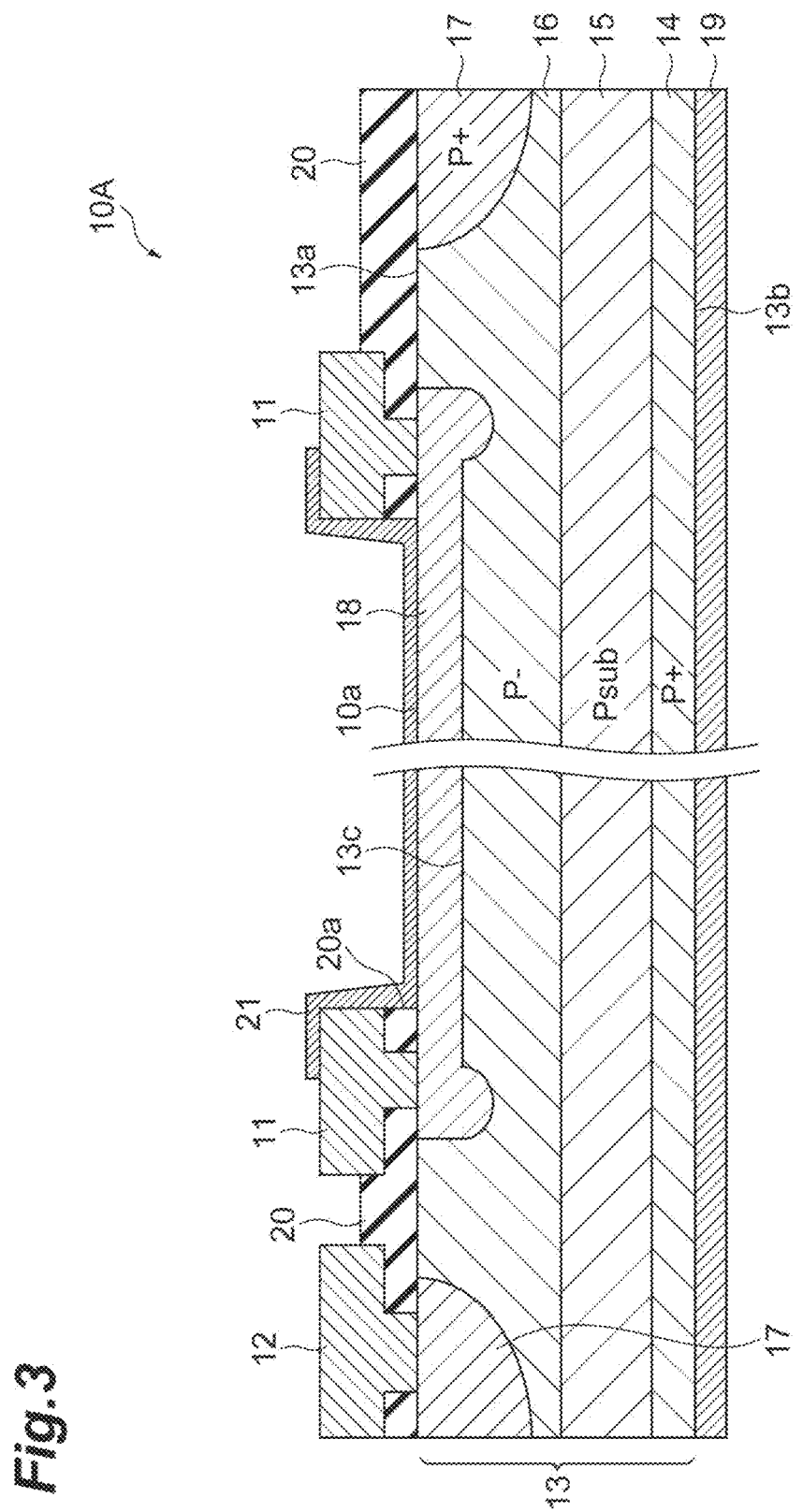
FIG. 3 is a cross-sectional view illustrating an internal configuration of a semiconductor light detection element.

FIG. 3 is a cross-sectional view illustrating an internal configuration of the semiconductor light detection element 10A and illustrates a cross section of the semiconductor light detection element 10A taken along line II-II in FIG. 1. The semiconductor light detection element 10A is a pn junction type photodiode. As illustrated in FIG. 3, in addition to the cathode electrode 11, the first anode electrode 12, the semiconductor portion 13, and the second anode electrode 19 described above, the semiconductor light detection element 10A according to the present embodiment further includes a protective film 20 and a carbon nanotube (CNT) film 21.

The semiconductor portion 13 has a pn junction 13c inside and photoelectrically converts incident light. That is, carriers generated in response to the incidence of light on the pn junction 13c functioning as a photoelectric conversion portion are extracted as an electrical signal. The semiconductor portion 13 is, for example, a silicon substrate. The semiconductor portion 13 has a flat front surface 13a and a flat back surface 13b facing each other in a thickness direction. The front surface 13a includes a light reception region 10a. Furthermore, the semiconductor portion 13 includes a high concentration p-type semiconductor region ($p^+$ region) 14, a p-type semiconductor region (p region) 15, a low concentration p-type semiconductor region ($p^-$ region) 16, a high concentration p-type semiconductor region ($p^+$ region) 17, and a high concentration n-type semiconductor region ($n^+$ region) 18. In addition, "high concentration" denotes that the concentration of impurities is, for example, $1 \times 10^{17}$ cm$^{-3}$ or more, and "low concentration" denotes that the concentration of impurities is, for example, $1 \times 10^{15}$ cm$^{-3}$ or less.

The $p^+$ region 14 is an impurity region provided in a region in the semiconductor portion 13 including the back surface 13b. The $p^+$ region 14 is formed, for example, by ion implantation of p-type impurities from the back surface side of a p-type silicon substrate which is a base of the semiconductor portion 13. The p region 15 is a region located between the $p^+$ region 14 and the $p^-$ region 16 and is a region in which the p-type silicon substrate remains as it is. The $p^-$ region 16 is an impurity region provided on the front surface 13a side in the semiconductor portion 13. The $p^-$ region 16 is formed, for example, by ion implantation of a small amount of n-type impurities from the front surface side of a p-type silicon substrate. The $p^+$ region 17 is an impurity region provided in a region in the semiconductor portion 13 including the front surface 13a. The $p^+$ region 17 is formed, for example, by ion implantation of p-type impurities into the $p^-$ region 16.

The $n^+$ region 18 is an impurity region provided in a region in the semiconductor portion 13 including the front surface 13a. The pn junction 13c is formed at an interface between the $n^+$ region 18 and the $p^-$ region 16 inside the semiconductor portion 13. The pn junction 13c overlaps with the light reception region 10a when viewed from the thickness direction of the semiconductor portion 13. The $n^+$ region 18 is formed, for example, by ion implantation of a large amount of n-type impurities into the $p^-$ region 16. The $n^+$ region 18 overlaps with the light reception region 10a and the cathode electrode 11 when viewed from the thickness direction of the semiconductor portion 13. The $n^+$ region 18 has, for example, a planar shape such as a quadrangle. The $p^+$ region 17 surrounds the $n^+$ region 18 when viewed from the thickness direction of the semiconductor portion 13. The thickness of the $n^+$ region 18 (that is, the depth of the pn junction 13c from the front surface 13a) is, for example, in a range of 70 nm to 150 nm.

The second anode electrode 19 is provided on the entire surface of the back surface 13b of the semiconductor portion 13 and is in ohmic contact with the $p^+$ region 14. The second anode electrode 19 has, for example, a stacked structure such as Ti/Ni/Au. The protective film 20 is an insulating dielectric film and is, for example, a silicon oxide film. The protective film 20 covers a region of the front surface 13a of the semiconductor portion 13 excluding the light reception region 10a. In other words, the inside of an opening 20a formed in the protective film 20 is the light reception region 10a. Inside the opening 20a, the $n^+$ region 18 is exposed from the protective film 20. The thickness of the protective film 20 is, for example, in a range of 100 nm to 300 nm.

The cathode electrode 11 is an example of a metal portion provided on the front surface 13a of the semiconductor portion 13. The cathode electrode 11 of the present embodiment is provided on the protective film 20 and is in ohmic contact with the $n^+$ region 18 through an opening formed in the protective film 20. The cathode electrode 11 is made of, for example, a metal such as aluminum (Al). The side surface on the inner side (the light reception region 10a side) of the cathode electrode 11 is formed to be flush with a side surface defining the opening 20a of the protective film 20. In other words, the side surface of the inner side of the cathode electrode 11 defines the outer edge of the light reception region 10a. The thickness of the cathode electrode 11 relative to the upper surface (the surface of the protective film 20 opposite to the semiconductor portion 13) of the protective film 20 is, for example, in a range of 700 nm to 1000 nm. Therefore, the height of the upper surface (the surface of the cathode electrode 11 opposite to the semiconductor portion 13) of the cathode electrode 11 relative to the front surface 13a is, for example, in a range of 800 nm to 1300 nm. The first anode electrode 12 is provided on the protective film 20 and is in ohmic contact with the p$^+$ region 17 through an opening formed in the protective film 20. The first anode electrode 12 is made of, for example, a metal such as aluminum (Al).

The CNT film 21 is a conductive film formed by depositing a plurality of carbon nanotubes. In order to suppress the charge-up of the front surface of the n$^+$ region 18, the CNT film 21 is provided on the light reception region 10a so as to cover the entire light reception region 10a and is in contact with the front surface of the n$^+$ region 18. In addition, a portion of the CNT film 21 is provided on the cathode electrode 11 and is in contact with the cathode electrode 11. Therefore, the CNT film 21 allows the front surface of the n$^+$ region 18 and the cathode electrode 11 to be in electrical conduction with each other. The light incident on the semiconductor light detection element 10A passes through the CNT film 21 and reaches the semiconductor portion 13.

When the semiconductor light detection element 10A is used, the cathode electrode 11 is connected to a ground potential (GND potential) through the pin 4 (refer to FIGS. 1 and 2). Then, when light passes through the CNT film 21 and is incident on the semiconductor portion 13 from the light reception region 10a of the front surface 13a, a portion of the incident light reaches the inside of a depletion layer formed in the vicinity of the pn junction 13c. In the depletion layer, carriers are generated in response to the incident light, and the carriers are output to the outside of the light detection device 1 through the second anode electrode 19 and the pin 3 (refer to FIGS. 1 and 2).

Herein, the CNT film 21 of the present embodiment will be further described. The film thickness of the CNT film 21 on the light reception region 10a is, for example, in a range of 10 to 50 nm. In order to appropriately release the charges accumulated on the front surface of the n$^+$ region 18, the sheet resistance of the CNT film 21 is set to, for example, $10^8 \Omega/\square$ or less. However, such a conductivity as a transparent electrode is not required, and the sheet resistance of the CNT film 21 is set to, for example, $10^4 \Omega/\square$ or more. In addition, the sheet resistance of a transparent electrode generally used in a semiconductor device is generally in a range of about $10^2$ to $10^3 \Omega/\square$. Therefore, as compared with the CNT film used for the transparent electrode, the density of carbon nanotubes in the CNT film 21 is small (non-dense), and the sheet resistance is high, so that ultraviolet rays are easily transmitted. In addition, the sheet resistance of the CNT film 21 manufactured as a prototype by the applicant was $10^5 \Omega/\square$.

In one example, a ratio of single-walled carbon nanotubes contained in the CNT film 21 is larger than a ratio of multi-walled carbon nanotubes. The single-walled carbon nanotubes have substantially the same degree of conductivity as that of the multi-walled carbon nanotubes. This is because both the single-walled carbon nanotubes and the multi-walled carbon nanotubes exhibit substantially the same degree of conductivity per one carbon nanotube. In addition, the single-walled carbon nanotubes have higher transparency than the multi-walled carbon nanotubes. In the multi-walled carbon nanotubes, light is absorbed not only in the outer layer but also in the inner layer. Therefore, by increasing the ratio of the single-walled carbon nanotubes, it is possible to reduce the resistance without lowering the light transmittance of the CNT film 21. The appropriate ratio of the single-walled carbon nanotubes is, for example, 90% or more.

In another example, the ratio of the multi-walled carbon nanotubes contained in the CNT film 21 is larger than the ratio of the single-walled carbon nanotubes. Generally, the process of manufacturing the multi-walled carbon nanotubes is simpler than the process of manufacturing the single-walled carbon nanotubes, and the multi-walled carbon nanotubes can be manufactured at lower cost than the single-walled carbon nanotubes. In this case, the appropriate ratio of the multi-walled carbon nanotubes is, for example, 90% or more.

In the present embodiment, the transmittance of the CNT film 21 in a wavelength range (that is, ultraviolet range) of 200 nm or more and 400 nm or less is, for example, 85% or more, and in one embodiment, 93%. The light transmittance power to the object in the ultraviolet range is lower than that in the visible range, and the light receiving sensitivity in the semiconductor portion 13 in the ultraviolet range is also lower than that in the visible range. Therefore, it is preferable to secure a sufficient amount of the ultraviolet light passing through the CNT film 21. For this reason, it is preferable that the CNT film 21 is thin and has a low density of carbon nanotubes. In addition, the light transmittance of the CNT film 21 manufactured as a prototype by the applicant was 93% or more in a wavelength range of 200 nm to 1600 nm.

The light transmittance of the CNT film 21 is roughly determined by a density of carbon nanotubes constituting the CNT film 21, ratios of the single-walled carbon nanotubes and the multi-walled carbon nanotubes, and a film thickness of the CNT film 21. The light transmittance of the CNT film 21 increases as the density of the carbon nanotubes decreases, and the light transmittance of the CNT film 21 decreases as the density of the carbon nanotubes increases. In addition, the light transmittance of the CNT film 21 increases as the ratio of the single-walled carbon nanotubes increases, and the light transmittance of the CNT film 21 decreases as the ratio of the multi-walled carbon nanotubes increases. In addition, the light transmittance of the CNT film 21 increases as the film thickness decreases, and the light transmittance of the CNT film 21 decreases as the film thickness increases. Ultraviolet light has lower transmittance to an object as compared with visible light having a longer wavelength than ultraviolet light. For this reason, it is preferable that the number of carbon nanotubes per unit area is set to be small (for example, the film thickness is set to be small) as compared with the transparent electrode in order to ensure the light transparency to ultraviolet rays equal to or larger than the light transparency of the transparent electrode to visible light.

Figure 4:
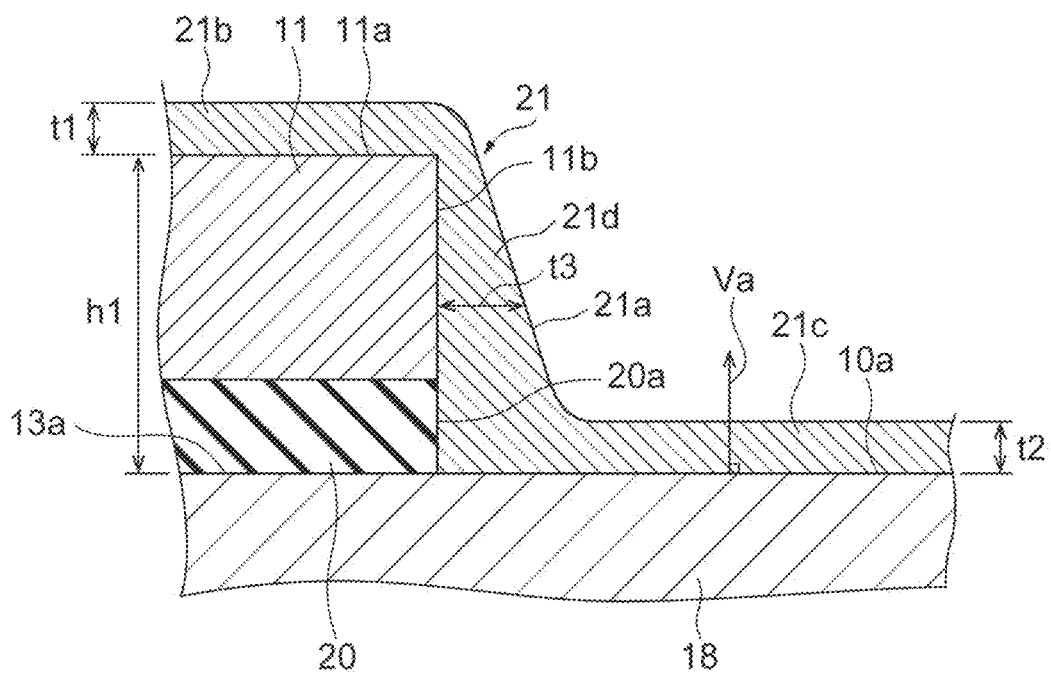
FIG. 4 is an enlarged cross-sectional view illustrating a peripheral edge portion of a CNT film.

In addition, the peripheral edge portion of the CNT film 21 extends over the upper surface of the cathode electrode 11. In the present embodiment, since the cathode electrode 11 has a rectangular closed frame shape, the CNT film 21 is formed to extends over the upper surface of the cathode electrode 11 from the inside of the frame. That is, the upper surface (the surface of the CNT film 21 opposite to the semiconductor portion 13) of the CNT film 21 on the light reception region 10a is at a lower position than the upper surface of the cathode electrode 11, and thus, the CNT film 21 continuously extends so as to extends over the upper surface of the cathode electrode 11 from above the light reception region 10a. FIG. 4 is a cross-sectional view illustrating the peripheral edge portion of the CNT film 21 in an enlarged manner. As illustrated in FIG. 4, a extending-over portion 21b including the end edge of the CNT film 21 is provided on an upper surface 11a of the cathode electrode 11. A thickness t1 of the extending-over portion 21b is substantially equal to a thickness t2 of a main portion 21c provided on the light reception region 10a of the CNT film 21.

Figure 5:
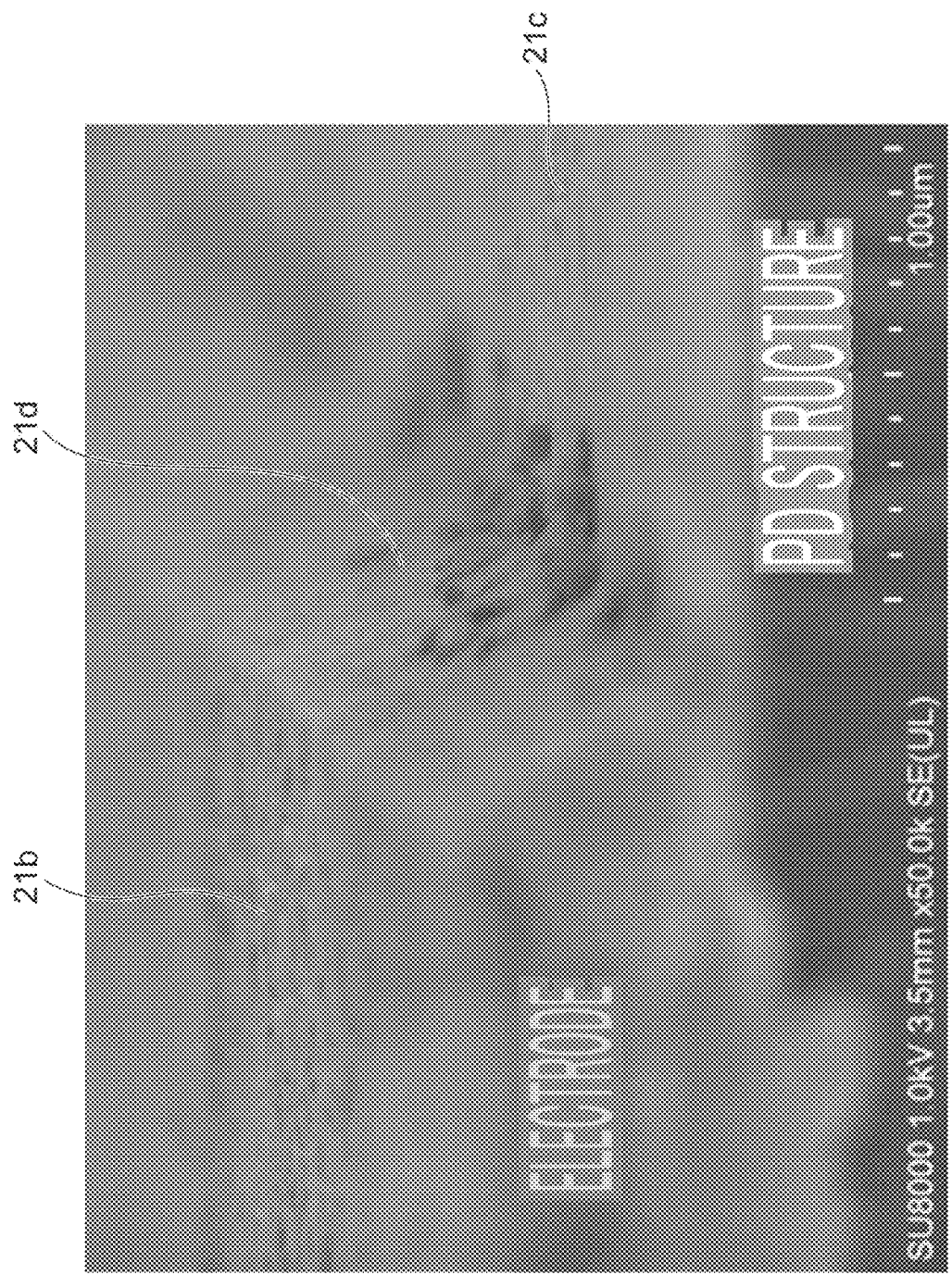
FIG. 5 is a photomicrograph showing a CNT film of a semiconductor light detection element manufactured as a prototype.
Figure 6:
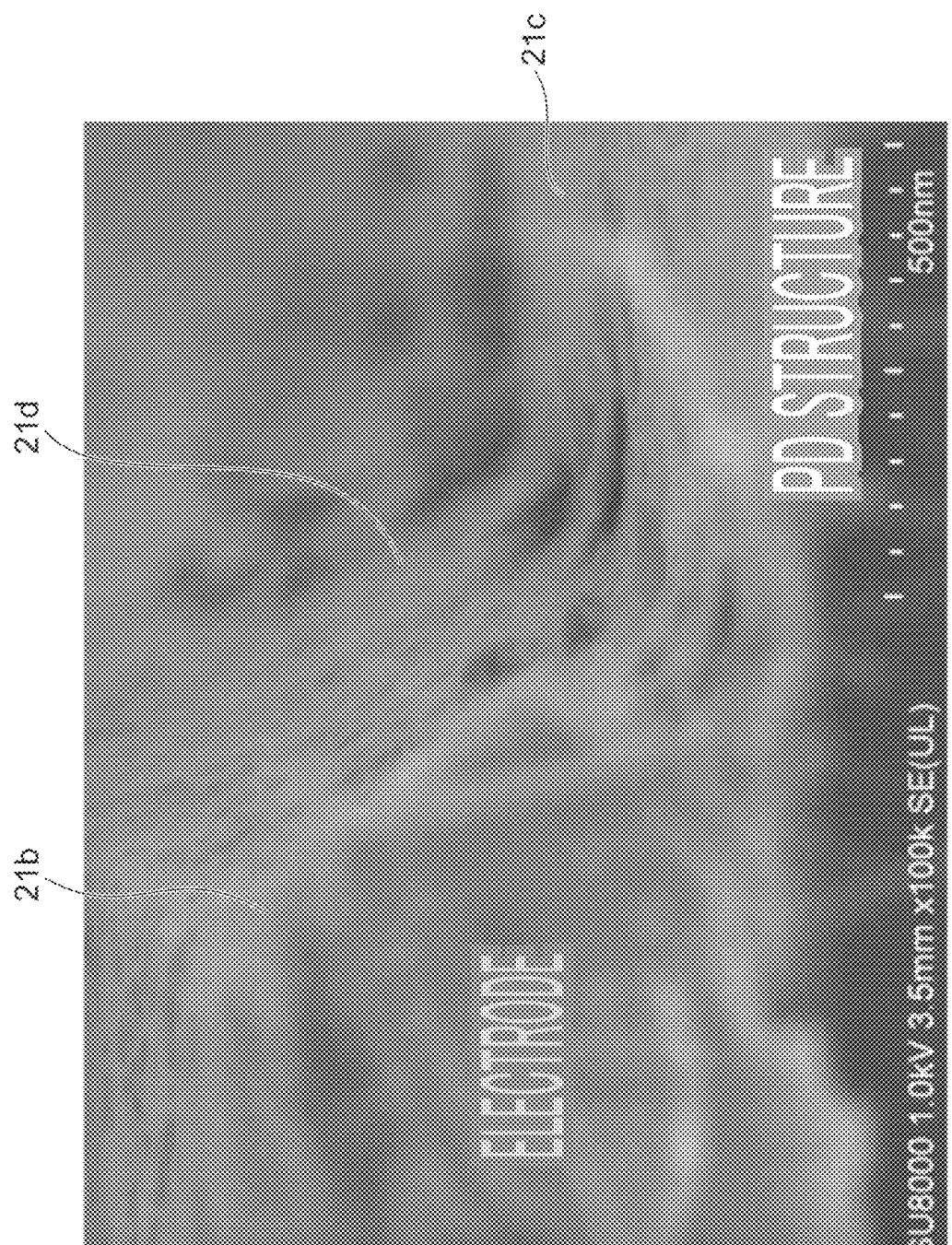
FIG. 6 is a photomicrograph showing a CNT film of a semiconductor light detection element manufactured as a prototype.

The CNT film 21 further includes a rising portion 21d provided between the extending-over portion 21b and the main portion 21c. The rising portion 21d is provided on an inner side surface 11b of the cathode electrode 11 and on the side surface (that is, a step difference portion of the cathode electrode 11 and the protective film 20) of the opening 20a of the protective film 20 to connect the extending-over portion 21b and main portion 21c with each other. The inner side surface 11b of the cathode electrode 11 and the side surface of the opening 20a of the protective film 20 are substantially parallel to a normal line Va of the front surface 13a, but the front surface of the rising portion 21d becomes an inclined surface 21a inclined with respect to the normal line Va. Specifically, the inclined surface 21a is inclined in a slope shape so as to be closer to the cathode electrode 11 as the inclined surface is separated from the front surface 13a. In other words, the thickness of the rising portion 21d is larger as the rising portion approaches the front surface 13a. As a result, a thickness t3 of the rising portion 21d is larger than the thickness t2 of the main portion 21c. In addition, FIGS. 5 and 6 are photomicrographs showing the CNT film of the semiconductor light detection element manufactured as a prototype. Referring to these figures, it can be understood that the CNT film 21 has the inclined surface 21a at the step difference portion of the cathode electrode.

In FIG. 4, the rising portion 21d is in contact with the inner side surface 11b of the cathode electrode 11 and the side surface of the opening 20a of the protective film 20, but an air gap may be formed in at least one of a space between the rising portion 21d and the inner side surface 11b of the cathode electrode 11 and a space between the rising portion 21d and the side surface of the opening 20a of the protective film 20.

Figure 7:
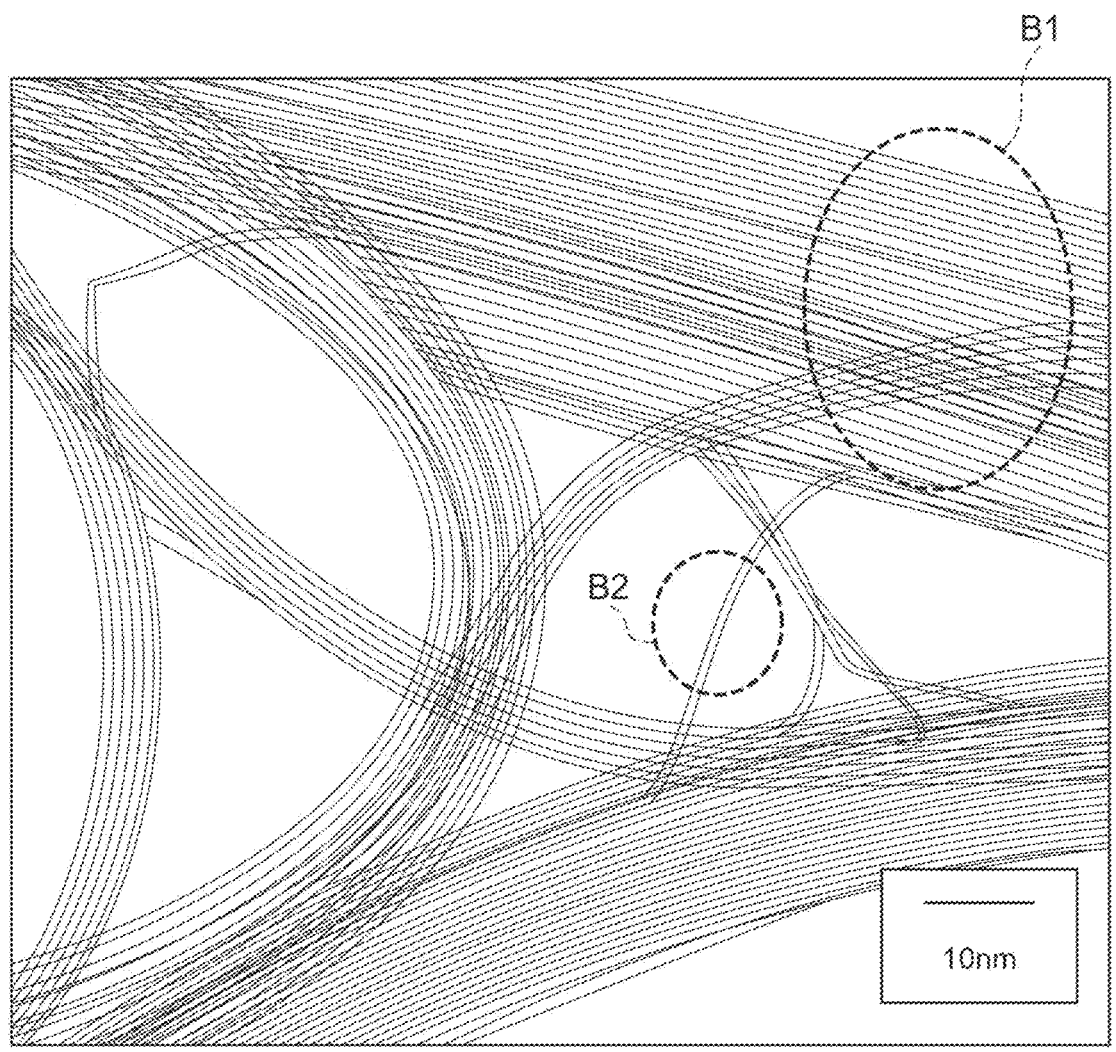
FIG. 7 is an enlarged schematic view illustrating an appearance of carbon nanotubes contained in a CNT film.

FIG. 7 is an enlarged schematic view illustrating an appearance of a plurality of carbon nanotubes contained in the CNT film 21. As illustrated in FIG. 7, when the plurality of carbon nanotubes exist in the CNT film 21, the plurality of carbon nanotubes are aggregated by an intermolecular force to form a bundle (B1 in the figure, and hereinafter, such a bundle is referred to as bundle-shaped carbon nanotubes). In addition, some carbon nanotubes do not form a bundle, but exist in a single state (B2 in the figure, and hereinafter, such carbon nanotubes are referred to as non-bundle-shaped carbon nanotubes). The large number of carbon nanotubes contained in the CNT film 21 may be configured with the bundle-shaped carbon nanotubes and the non-bundle-shaped carbon nanotubes. Since the bundle-shaped carbon nanotubes are longer than the non-bundle-shaped carbon nanotubes, it becomes easier to extend over the step differences of the cathode electrode 11. The upper limit of the length of carbon nanotubes contained in the CNT film 21 is, for example, 5 µm or less for the non-bundle-shaped carbon nanotubes, and the upper limit of the length of the carbon nanotubes is, for example, 8 µm or less for the bundle-shaped carbon nanotubes.

The length of the large number of carbon nanotubes contained in the CNT film 21 is equal to or larger than a height h1 of the upper surface 11a of the cathode electrode 11 relative to the front surface 13a. Typically, the height h1 is 1 µm or less, and in this case, the preferred length of the plurality of carbon nanotubes contained in the CNT film 21 is 1 µm or more. Therefore, the carbon nanotubes can appropriately extend over the step difference of the cathode electrode 11. Herein, "the length of the plurality of carbon nanotubes contained in the CNT film 21" refers to the average length of the plurality of carbon nanotubes contained in the CNT film 21. In addition, in a case where the plurality of carbon nanotubes are configured with the bundle-shaped carbon nanotubes and the non-bundle-shaped carbon nanotubes, the average length of the plurality of carbon nanotubes refers to the average length calculated from the length of the bundle-shaped carbon nanotubes and the length of the non-bundle-shaped carbon nanotubes.

Figure 8:
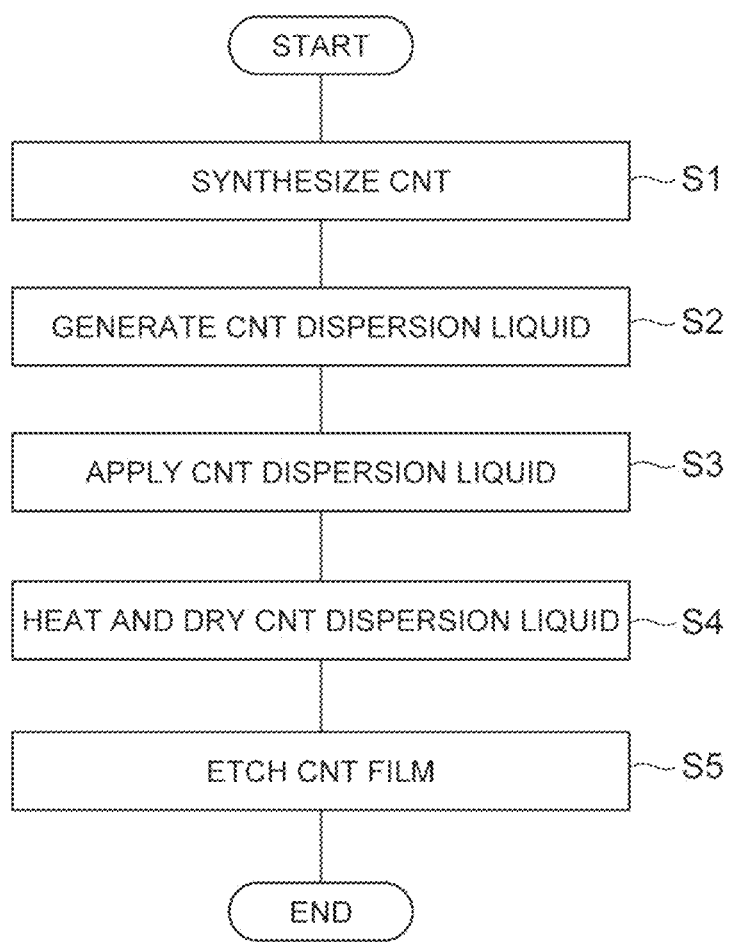
FIG. 8 is a flowchart illustrating an example of a method of manufacturing a CNT film.

The CNT film 21 having the above-described configuration may be formed by spin coating, for example. FIG. 8 is a flow chart showing an example of a method of manufacturing the CNT film 21. First, a plurality of carbon nanotubes are synthesized in a chamber by chemical vapor deposition (step S1). The reaction temperature at this time is, for example, 600° C. to 800° C. Next, the plurality of carbon nanotubes are placed in a solvent to which an additive is added and stirred to generate a CNT dispersion liquid (step S2). Subsequently, the CNT dispersion liquid is applied on the front surface 13a of the semiconductor portion 13 on which the protective film 20 and the cathode electrode 11 are formed (step S3). As a coating method at this time, for example, spin coating, spray coating, or blade coating is preferable in order to form the CNT film 21 having a uniform film thickness. In addition, the thickness of the dispersion liquid after the dropping is sufficiently larger than a total thickness of the protective film 20 and the cathode electrode 11. In the spin coating and the blade coating, an excessive dispersion liquid is removed after a dropping, and the thickness of the dispersion liquid is smaller than or substantially equal to the thickness of the electrode. Subsequently, the coated CNT dispersion liquid is heated and dried (step S4). As a result, the water and the additives are evaporated, and only the carbon nanotubes remain in the form of a film on the front surface 13a. In this manner, by applying and drying the dispersion liquid containing carbon nanotubes, the CNT film 21 can be formed on the semiconductor portion 13 at a low temperature. Subsequently, by using a general photolithography technique and a general dry etching technique, the CNT film 21 located outside the cathode electrode 11 is removed (step S5). As a result, the CNT film 21 of the present embodiment is manufactured.

The effects obtained by the semiconductor light detection element 10A according to the present embodiment described above will be described. In the semiconductor light detection element 10A, the CNT film 21 formed by depositing the plurality of the carbon nanotubes is provided on the light reception region 10a. The carbon nanotube has a sufficiently conductivity to release the charges generated on the front surface 13a (specifically, the front surface of the $n^+$ region 18) of the semiconductor portion 13 to the cathode electrode 11 connected to the ground potential through the CNT film 21. Therefore, similarly to the case where a noble metal film is provided as in Patent Literature 1, for example, the charge-up of the front surface 13a of the semiconductor portion 13 can be appropriately prevented. As a result, it is possible to suppress the deterioration of detection sensitivity at the time of detecting the ultraviolet light. Furthermore, carbon nanotubes have high transparency as compared with, for example, noble metals. Therefore, the reflection and absorption of the ultraviolet light can be reduced, and thus, the reduction of the light amount of the ultraviolet light incident on the front surface 13a of the semiconductor portion 13 can be suppressed. As a result, according to the semiconductor light detection element 10A, it is possible to suppress a decrease in detection sensitivity as compared with, for example, the case where a noble metal film is provided.

Figure 9:
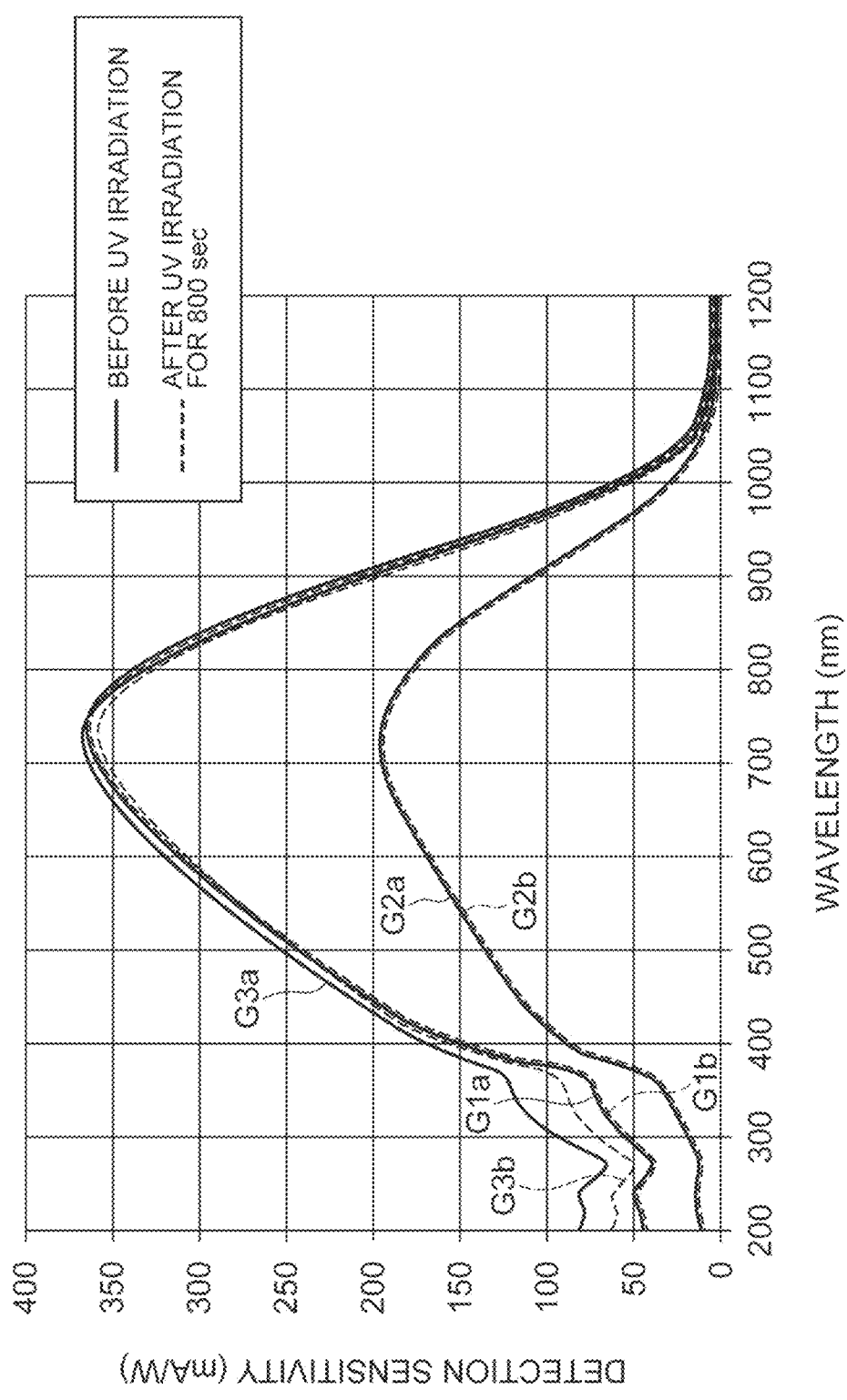
FIG. 9 is a graph showing results of measurement of spectral sensitivity characteristics of a semiconductor light detection element manufactured as a prototype.

FIG. 9 is graphs showing the results of measurement of the spectral sensitivity characteristics of the semiconductor light detection element manufactured as a prototype. In FIG. 9, solid-line graphs G1a, G2a, and G3a show spectral sensitivity characteristics before the irradiation with ultraviolet light, and broken-line graphs G1b, G2b, and G3b show spectral sensitivity characteristics after the irradiation with ultraviolet light (Xe excimer lamp light) for 800 seconds. In addition, the graphs G1a and G1b show the spectral sensitivity characteristics of the semiconductor light detection element having the CNT film formed on the light reception region, the graphs G2a and G2b illustrate the spectral sensitivity characteristics of the semiconductor light detection element having the noble metal film formed on the light reception region, and the graphs G3a and G3b show the spectral sensitivity characteristics of the semiconductor light detection element having no conductive film on the light reception region. As shown in the graphs G3a and G3b, even in a case where the conductive film is not provided on the light reception region, in the wavelength range of larger than 400 nm, there is observed almost no change in the detection sensitivity before and after the irradiation with ultraviolet light. However, in the wavelength range of 400 nm or less, the detection sensitivity is greatly deteriorated after the irradiation relative to before the irradiation with ultraviolet light. In addition, in a case where the noble metal film is provided on the light reception region, as shown in the graphs G2a and G2b, the deterioration of detection sensitivity is effectively suppressed even in the wavelength range of 400 nm or less, and there is observed almost no change in detection sensitivity before and after the irradiation. However, as compared with the case where the conductive film is not provided, the detection sensitivity is greatly reduced. On the other hand, in a case where the CNT film is provided on the light reception region, as shown in the graphs G1a and G1b, in the wavelength range of 400 nm or less, there is observed almost no change in detection sensitivity before and after the irradiation, and as compared with the case where the noble metal film is provided, the degree of the decrease in detection sensitivity is small.

Figure 10:
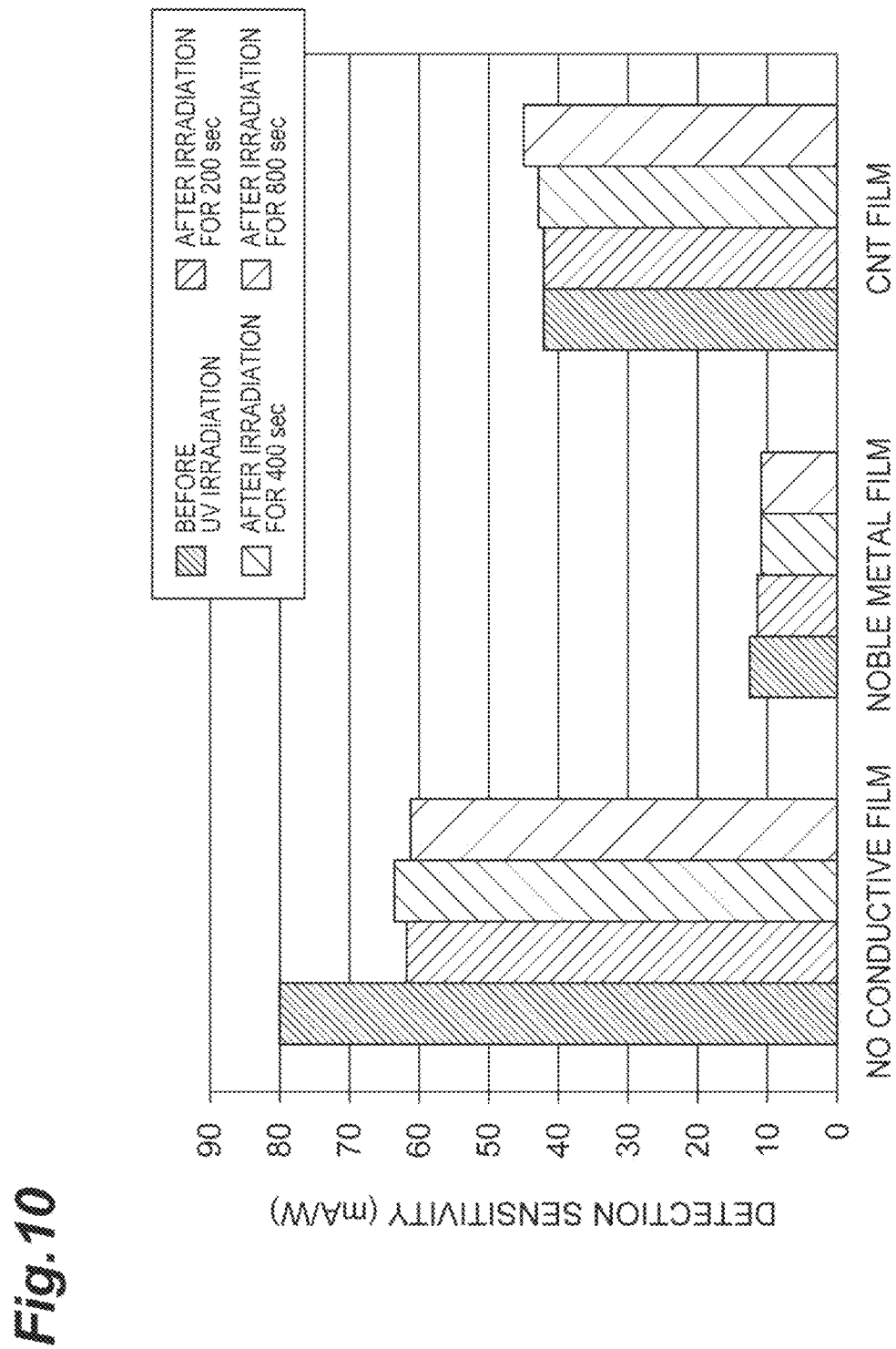
FIG. 10 is a graph showing results of measurement of detection sensitivity before irradiation with ultraviolet light, after irradiation for 200 seconds, after irradiation for 400 seconds, and after irradiation for 800 seconds with respect to a case where a conductive film is not provided on a light reception region, a case where a noble metal film is provided, and a case where a CNT film is provided.

FIG. 10 is a graph showing the results of measurement of the detection sensitivity in the wavelength 200 nm before the irradiation with ultraviolet light (Xe excimer lamp light), after the irradiation for 200 seconds, after the irradiation for 400 seconds, and after the irradiation for 800 seconds with respect to the case where the conductive film is not provided on the light reception region, the case where the noble metal film is provided, and the case where the CNT film is provided. As shown in FIG. 10, in a case where the conductive film is not provided, the detection sensitivity which is about 80 (mA/W) before the irradiation is deteriorated to about 60 (mA/W) after the irradiation for 200 seconds. In addition, in a case where the noble metal film is provided, the detection sensitivity is hardly deteriorated even after the irradiation for 800 seconds, but the detection sensitivity before the irradiation becomes about 10 (mA/W), which is greatly lowered as compared with the case where the conductive film is not provided. On the other hand, in a case where the CNT film is provided, the detection sensitivity is hardly deteriorated even after the irradiation for 800 seconds, and the detection sensitivity before the irradiation becomes about 40 (mA/W), which is greatly improved as compared with the case where the noble metal film is provided.

As apparent from the results shown in FIGS. 9 and 10, according to the semiconductor light detection element 10A according to the present embodiment, it is possible to effectively suppress a decrease in detection sensitivity as compared with, for example, the case where the noble metal film is provided.

In addition, in the semiconductor light detection element 10A, the cathode electrode 11 is provided on the front surface 13a of the semiconductor portion 13. Then, the CNT film 21 extends over the upper surface 11a of the cathode electrode 11. Therefore, the contact area between the CNT film 21 and the cathode electrode 11 is increased, and thus, the charges transferred from the front surface 13a of the semiconductor portion 13 to the CNT film 21 can be appropriately released through the cathode electrode 11. If such a configuration is to be realized, for example, in the noble metal film of Patent Literature 1, there is a concern that electrical conduction failure may occur due to disconnection of the noble metal film at the step difference between the front surface 13a of the semiconductor portion 13 and the cathode electrode 11. This is because, in many cases, the noble metal film is formed by vapor deposition, but the noble metal hardly adheres to the side surface. On the other hand, in the CNT film 21, since long fibrous carbon nanotubes can extend from the front surface 13a of the semiconductor portion 13 to the upper surface 11a of the cathode electrode 11 (refer to FIGS. 5 and 6), these components can also be appropriately conducted at the step difference between the front surface 13a of the semiconductor portion 13 and the cathode electrode 11.

In addition, as in the present embodiment, the plurality of carbon nanotubes of the CNT film 21 may be configured with the bundle-shaped carbon nanotubes and the non-bundle-shaped carbon nanotubes. Even in such a case, it is possible to preferably realize the CNT film 21 that exhibits the above-described functions. In addition, the plurality of the carbon nanotubes of the CNT film 21 may be configured only by the non-bundle-shaped carbon nanotubes.

In addition, as in the present embodiment, the sheet resistance of the CNT film 21 may be $10^4 \Omega/\square$ or more. The CNT film 21 only needs to release the charges generated on the front surface 13a of the semiconductor portion 13. Therefore, high conductivity like a so-called transparent electrode is not necessarily required for the CNT film 21, and the CNT film 21 may have a relatively large sheet resistance as described above.

In addition, as in the present embodiment, the length of the carbon nanotube contained in the CNT film 21 may be equal to or larger than the height h1 of the upper surface 11a of the cathode electrode 11 relative to the front surface 13a. Therefore, it is possible to more effectively prevent the electrical conduction failure due to the disconnection of the CNT film 21 at the step difference between the front surface 13a of the semiconductor portion 13 and the cathode electrode 11.

In addition, as in the present embodiment, the length of the carbon nanotube contained in the CNT film 21 may be 1 μm or more. The height h1 of the upper surface 11a of the cathode electrode 11 relative to the front surface 13a of the semiconductor portion 13 is typically 1 μm or less. Therefore, by setting the length of the carbon nanotube to be 1 μm or more, it is possible to more effectively prevent the electrical conduction failure due to the disconnection of the CNT film 21.

In addition, as described above, the ratio of the single-walled carbon nanotubes contained in the CNT film 21 may be larger than the ratio of the multi-walled carbon nanotubes. The single-walled carbon nanotubes have higher transparency than the multi-walled carbon nanotubes while having the same degree of conductivity as the multi-walled carbon nanotubes. Therefore, according to such a configuration, it is possible to more effectively suppress a decrease in detection sensitivity of the semiconductor light detection element 10A while appropriately preventing the charge-up of the front surface 13a of the semiconductor portion 13. Alternatively, as described above, the ratio of the multi-walled carbon nanotubes contained in the CNT film 21 may be larger than the ratio of the single-walled carbon nanotubes. Generally, the process of manufacturing the multi-walled carbon nanotubes is simpler than the process of manufacturing the single-walled carbon nanotubes, and the multi-walled carbon nanotubes can be manufactured at lower cost than the single-walled carbon nanotubes. Therefore, according to such a configuration, it is possible to provide a low cost semiconductor light detection element 10A that is easy to manufacture.

In addition, as in the present embodiment, the transmittance of the CNT film 21 in a wavelength range of 400 nm or less may be 85% or more. Therefore, the semiconductor light detection element 10A having sufficient detection sensitivity to ultraviolet light can be provided. In addition, in this case, the transmittance of the CNT film 21 in a wavelength range of 200 nm or more may be 85% or more.

Second Embodiment

FIG. 11 is a cross-sectional view illustrating a configuration of a solid-state imaging element 10B as a semiconductor light detection element according to a second embodiment of the present disclosure. The solid-state imaging element 10B is a back-illumination type charge coupled device (CCD) image sensor for mainly capturing an ultraviolet light image. As illustrated in FIG. 11, the solid-state imaging element 10B includes a semiconductor portion 30. The semiconductor portion has a p$^+$-type semiconductor substrate 22 and a p$^-$-type semiconductor layer 23 epitaxially grown on one surface of the p$^+$-type semiconductor substrate 22. The p$^+$-type semiconductor substrate 22 and the p$^-$-type semiconductor layer 23 are made of, for example, a silicon crystal to which impurities are added.

Gate insulating films 24, 25, and 26 are provided on one surface 30a of the semiconductor portion 30. The gate insulating films 24 and 26 are, for example, silicon oxide films, and the gate insulating film 25 is, for example, a silicon nitride film. That is, the gate insulating films 24, 25, and 26 have an oxide film-nitride film-oxide film (ONO) structure. A signal readout circuit 27 is provided on the gate insulating films 24, 25, and 26. That is, the signal readout circuit 27 is provided on one surface 30a of the semiconductor portion 30 through the gate insulating films 24, 25, and 26. The signal readout circuit 27 includes a plurality of charge transfer electrodes. A metal interconnection 28 for signal input/output to the signal readout circuit 27 is provided on the signal readout circuit 27. The metal interconnection 28 is made of, for example, aluminum. An under bump metal (UBM) 29 for providing a solder bump is provided on the metal interconnection 28.

A recess 30c is provided on the other surface 30b (the front surface of the semiconductor portion in the present embodiment) of the semiconductor portion 30. The recess 30c has a truncated pyramid shape (for example, a truncated quadrangular pyramid shape) spreading toward the side opposite to the one surface 30a side of the semiconductor portion 30. A bottom surface 30e of the recess 30c is configured by the p$^-$-type semiconductor layer 23. In the semiconductor portion 30, the bottom surface 30e of the recess 30c serves as a light reception region that receives incident light. In addition, a thinned portion 30d which is the bottom portion of the recess 30c serves as an imaging region, and light incident on the bottom surface 30e is photoelectrically converted in the thinned portion 30d.

An accumulation layer 31 for eliminating a back side well is formed in a portion of the p$^-$-type semiconductor layer 23 corresponding to the bottom surface 30e of the recess 30c. The accumulation layer 31 is formed by ion implantation or diffusion of p-type impurities into the portion of the p$^-$-type semiconductor layer 23 corresponding to the bottom surface 30e. In the semiconductor portion 30, the region of the p$^-$-type semiconductor layer 23 ranging from the accumulation layer 31 to one surface 30a of the semiconductor portion 30 functions as a photoelectric conversion region. In addition, although omitted in illustration, an n-type buried channel facing each charge transfer electrode of the signal readout circuit 27, an n-type accommodation portion for accommodating electrons generated in the photoelectric conversion region, and the like are formed in a portion on one surface 30a side in the photoelectric conversion region.

A metal layer 33 is formed on the other surface 30b of the semiconductor portion 30. An opening 33a for exposing the bottom surface 30e of the recess 30c from the metal layer 33 is provided on the metal layer 33. The metal layer 33 functions as a light shielding layer that blocks the incidence of light to a region other than the bottom surface 30e. When viewed from the thickness direction of the semiconductor portion 30, the shape of the opening 33a matches with the shape of the bottom surface 30e. The metal layer 33 is formed, for example, by plating with a thickness ranging from several μm to several tens of μm. An example of plating is electroless metal plating. In this case, the metal layer 33 is a plating layer. The plating layer is configured, for example, by forming a surface layer having a thickness of about 0.05 μm made of gold on an underlayer having a thickness of about 10 μm made of nickel by electroless Ni/Au plating.

The solid-state imaging element 10B further includes a CNT film 32. The CNT film 32 is a conductive film formed by depositing a plurality of carbon nanotubes. The CNT film 32 is provided on the bottom surface 30e to be in contact with the bottom surface 30e in order to suppress charge-up of the bottom surface 30e. In addition, a portion of the CNT film 32 is provided on the metal layer 33 and is in contact with the metal layer 33. Therefore, the CNT film 32 allows the bottom surface 30e and the metal layer 33 to be in electrical conduction with each other, and thus, charges generated on the bottom surface 30e which is a light reception region can be released through the CNT film 32 to, for example, the metal layer 33 connected to the ground potential. The light incident on the solid-state imaging element 10B passes through the CNT film 32 and reaches the bottom surface 30e of the semiconductor portion 30. In addition, the peripheral edge portion of the CNT film 32 extends over an upper surface 33b (surface of the metal layer 33 opposite to the semiconductor portion 30) of the metal layer 33. In the present embodiment, since the metal layer 33 has a closed frame shape, the CNT film 32 is formed to extends over the upper surface 33b of the metal layer 33 from the inside of the frame. In addition, the detailed structure, shape and characteristics of the CNT film 32 other than the above are the same as those of the CNT film 21 of the first embodiment, and thus, the description is omitted.

The effects obtained by the solid-state imaging element 10B according to the present embodiment described above will be described. In the solid-state imaging element 10B, the CNT film 32 formed by depositing a plurality of carbon nanotubes is provided on the bottom surface 30e of the semiconductor portion 30. Therefore, similarly to the first embodiment, the charge-up of the bottom surface 30e of the semiconductor portion 30 can be appropriately prevented. As a result, it is possible to suppress the deterioration of detection sensitivity at the time of detecting the ultraviolet light. Furthermore, carbon nanotubes have high transparency as compared with noble metals. Therefore, the reflection and absorption of ultraviolet light can be reduced, and thus, the reduction of the light amount of the ultraviolet light incident on the bottom surface 30e of the semiconductor portion 30 can be suppressed. As a result, according to the solid-state imaging element 10B, it is possible to suppress a decrease in detection sensitivity as compared with a case where a noble metal film is provided on the bottom surface 30e.

In addition, in the solid-state imaging element 10B, the metal layer 33 is provided on the bottom surface 30e of the semiconductor portion 30. The CNT film 32 extends over the upper surface 33b of the metal layer 33. Therefore, the contact area between the CNT film 32 and the metal layer 33 is increased, and thus, the charges transferred from the bottom surface 30e of the semiconductor portion 30 to the CNT film 32 can be appropriately released through the metal layer 33. In the CNT film 32, since long fibrous carbon nanotubes can extend from the bottom surface 30e of the semiconductor portion 30 to the upper surface 33b of the metal layer 33, these components can also be appropriately conducted at the step difference between the bottom surface 30e of the semiconductor portion 30 and the metal layer 33.

The semiconductor light detection element according to the present disclosure is not limited to the embodiments described above, and various other modifications are possible. For example, the embodiments described above may be combined with one another according to the necessary purpose and effect. In addition, in the first embodiment, since the cathode electrode has a rectangular frame shape and surrounds the light reception region, the difference in response speed according to the incident position can be reduced even in a case where the light reception region is wide. However, in a case where the light reception region is relatively small, the cathode electrode may not surround the light reception region, and the cathode electrode may be provided, for example, along only one side of the quadrangular light reception region.

REFERENCE SIGNS LIST

1 . . . light detection device, 2 . . . package, 2a . . . bottom surface, 2b . . . bottom plate portion, 3, 4 . . . pin, 5, 6 . . . bonding wire, 10A . . . semiconductor light detection element, 10B . . . solid-state imaging element, 10a . . . light reception region, 11 . . . cathode electrode, 11a . . . upper surface, 11b . . . inner side surface, 12 . . . first anode electrode, 13 . . . semiconductor portion, 13a . . . front surface, 13b . . . back surface, 13c . . . pn junction, 14 . . . $p^+$ region, 15 . . . p region, 16 . . . $p^-$ region, 17 . . . $p^+$ region, 18 . . . $n^+$ region, 19 . . . second anode electrode, 20 . . . protective film, 20a . . . opening, 21 . . . CNT film, 21a . . . inclined surface, 21b . . . extending-over portion, 21c . . . main portion, 21d . . . rising portion, 22 . . . $p^+$-type semiconductor substrate, 23 . . . $p^-$-type semiconductor layer, 24, 25, 26 . . . gate insulating film, 27 . . . signal readout circuit, 28 . . . metal interconnection, 30 . . . semiconductor portion, 30a . . . one surface, 30b . . . other surface, 30c . . . recess, 30d . . . thinned portion, 30e . . . bottom surface (light reception region), 31 . . . accumulation layer, 32 . . . CNT film, 33 . . . metal layer, 33a . . . opening, 33b . . . upper surface, Va . . . normal line

The invention claimed is:

1. A semiconductor light detection element comprising:
   a semiconductor portion having a front surface including a light reception region that receives incident light and configured to photoelectrically convert the incident light incident on the light reception region;
   a metal portion provided on the front surface; and
   a carbon nanotube film provided on the light reception region and formed by depositing a plurality of carbon nanotubes,
   wherein the carbon nanotube film includes a main portion provided on the light reception region, an extending-over portion provided on an upper surface of the metal portion, and a rising portion connecting the main portion and the extending-over portion with each other,
   a thickness of the rising portion in a direction along the front surface is larger than a thickness of the main portion in a direction perpendicular to the front surface, and
   the thickness of the rising portion on the main portion side is larger than the thickness of the rising portion on the extending-over portion side.

2. The semiconductor light detection element according to claim 1, wherein the plurality of carbon nanotubes are configured with bundle-shaped carbon nanotubes and non-bundle-shaped carbon nanotubes.

3. The semiconductor light detection element according to claim 1, wherein a sheet resistance of the carbon nanotube film is $10^4 \Omega/\square$ or more.

4. The semiconductor light detection element according to claim 1, wherein a length of the plurality of carbon nanotubes contained in the carbon nanotube film is equal to or larger than a height of the upper surface of the metal portion relative to the front surface.

5. The semiconductor light detection element according to claim 1, wherein a length of the plurality of carbon nanotubes contained in the carbon nanotube film is 1 μm or more.

6. The semiconductor light detection element according to claim 1, wherein a ratio of single-walled carbon nanotubes contained in the carbon nanotube film is larger than a ratio of multi-walled carbon nanotubes.

7. The semiconductor light detection element according to claim 1, wherein a ratio of multi-walled carbon nanotubes contained in the carbon nanotube film is larger than a ratio of single-walled carbon nanotubes.

8. The semiconductor light detection element according to claim 1, wherein transmittance of the carbon nanotube film in a wavelength range of 400 nm or less is 85% or more.

9. The semiconductor light detection element according to claim 8, wherein the transmittance of the carbon nanotube film in a wavelength range of 200 nm or more is 85% or more.

* * * * *